United States Patent
Lu et al.

(10) Patent No.: US 12,001,621 B1
(45) Date of Patent: Jun. 4, 2024

(54) TOUCH MODULE, TOUCH DISPLAY MODULE AND MANUFACTURING METHOD OF TOUCH MODULE

(71) Applicant: HENGHAO TECHNOLOGY CO., LTD., Hsin-chu County (TW)

(72) Inventors: Shih-Chung Lu, Taichung (TW);
Ming-Hung Yang, Taichung (TW);
Ching-Yu Tsai, Tainan (TW);
Kuan-Jen Chen, Kaohsiung (TW)

(73) Assignee: HENGHAO TECHNOLOGY CO., LTD., Hsin-chu County (TW)

( * ) Notice: Subject to any disclaimer, the term of this patent is extended or adjusted under 35 U.S.C. 154(b) by 0 days.

(21) Appl. No.: 18/127,614

(22) Filed: Mar. 28, 2023

(30) Foreign Application Priority Data

Mar. 1, 2023 (TW) ................... 112107252

(51) Int. Cl.
| | |
|---|---|
| *G06F 3/041* | (2006.01) |
| *B32B 27/28* | (2006.01) |
| *B32B 27/36* | (2006.01) |
| *G02F 1/1333* | (2006.01) |

(Continued)

(52) U.S. Cl.
CPC ............ *G06F 3/041* (2013.01); *B32B 27/281* (2013.01); *B32B 27/36* (2013.01); *G02F 1/133311* (2021.01); *G02F 1/13338* (2013.01); *H10K 59/873* (2023.02); *B32B 2255/10* (2013.01); *B32B 2255/20* (2013.01); *B32B 2255/205* (2013.01); *B32B 2255/28* (2013.01); *B32B 2457/202* (2013.01); *B32B 2457/206* (2013.01); *B32B 2457/208* (2013.01);

(Continued)

(58) Field of Classification Search
CPC ........... G06F 3/041; G06F 2203/04102; G06F 2203/04103; B32B 27/281; B32B 27/36; B32B 2255/10; B32B 2255/20; B32B 2255/205; B32B 2255/28; B32B 2457/202; B32B 2457/206; B32B 2457/208; G02F 1/133311; G02F 1/13338; G02F 2201/50; H10K 59/873; H10K 59/40

See application file for complete search history.

(56) References Cited

U.S. PATENT DOCUMENTS

| | | | | |
|---|---|---|---|---|
| 2010/0295812 A1* | 11/2010 | Burns | ................... | G06F 3/0412 345/173 |
| 2014/0204291 A1* | 7/2014 | Kung | ..................... | G06F 3/041 349/12 |

(Continued)

*Primary Examiner* — Amit Chatly
(74) *Attorney, Agent, or Firm* — Winston Hsu

(57) ABSTRACT

A touch module includes a flexible base, a moisture blocking film and a touch structure. The moisture blocking film has a first surface and a second surface opposite to the first surface, and the first surface directly contacts the flexible base. The touch structure is disposed on the second surface of the moisture blocking film and includes a first conductive layer disposed on the second surface, a first insulating layer disposed on the first conductive layer, a second conductive layer disposed on the first insulating layer and a second insulating layer disposed on the second conductive layer. An area of the moisture blocking film is greater than or equal to the sum of the areas of the touch electrode region and the peripheral circuit region of the touch structure. The water vapor transmission rate of the moisture blocking film is less than $5.0 \ast 10^{-4}$ g/(m$^2$*day).

9 Claims, 4 Drawing Sheets

(51) Int. Cl.
*H10K 59/40* (2023.01)
*H10K 59/80* (2023.01)

(52) U.S. Cl.
CPC .................... *G02F 2201/50* (2013.01); *G06F 2203/04102* (2013.01); *G06F 2203/04103* (2013.01); *H10K 59/40* (2023.02)

(56) References Cited

U.S. PATENT DOCUMENTS

2018/0190724 A1\* 7/2018 Kang .................... G06F 3/0446
2020/0343484 A1\* 10/2020 Iwase ................... H10K 50/844

\* cited by examiner

TOUCH MODULE, TOUCH DISPLAY MODULE AND MANUFACTURING METHOD OF TOUCH MODULE

BACKGROUND OF THE INVENTION

1. Field of the Invention

The present invention relates to a touch module, a touch display module including the touch module and a manufacturing method of the touch module, and more particularly to a touch module with a moisture blocking film, a touch display module including the touch module and a manufacturing method of the touch module.

2. Description of the Prior Art

In current touch modules, touch electrodes can be formed on the flexible base. However, since the flexible base is not effective in blocking moisture, moisture may enter from a side of the base and corrode the touch electrodes, thereby affecting the reliability of the touch modules. Therefore, to improve the moisture blocking effect of the touch modules is still an important issue in the present field.

SUMMARY OF THE INVENTION

In order to solve the above-mentioned problem, a touch module is provided by the present invention. The touch module includes a flexible base and a moisture blocking film directly disposed on the flexible base. In other words, the moisture blocking film may be disposed on the flexible base before disposing touch electrodes on the flexible base, and then the touch electrodes are formed on the moisture blocking film to form the touch module. Therefore, the moisture blocking effect of the touch module can be improved by the moisture blocking film while not changing the material of the flexible base.

In some embodiments, a touch module is provided by the present invention. The touch module includes a flexible base, a moisture blocking film disposed on the flexible base and a touch structure. A thickness of the flexible base ranges from 25 micrometers to 100 micrometers. The moisture blocking film has a first surface and a second surface opposite to the first surface, and the first surface directly contacts the flexible base. A thickness of the moisture blocking film ranges from 1 micrometer to 5 micrometers. The touch structure is disposed on the second surface of the moisture blocking film. The touch structure includes a first conductive layer directly disposed on the second surface of the moisture blocking film, a first insulating layer disposed on the first conductive layer and covering the first conductive layer, a second conductive layer directly disposed on the first insulating layer, and a second insulating layer disposed on the second conductive layer and covering the second conductive layer. The touch structure has a touch electrode region and a peripheral circuit region, and an area of the moisture blocking film is greater than or equal to a sum of an area of the touch electrode region and an area of the peripheral circuit region in a top view direction of the touch module. A water vapor transmission rate of the moisture blocking film is less than $5.0 \times 10^{-4}$ g/(m$^2$*day) at a temperature of 60° C. and a relative humidity of 90%.

In some embodiments, a touch display module is provided by the present invention. The touch display module includes the above-mentioned touch module and a display module attached to the touch module, wherein the touch structure is located between the display module and the moisture blocking film.

In some embodiments, a manufacturing method of a touch module is provided by the present invention. The manufacturing method includes providing a flexible base; forming a moisture blocking film on the flexible base, wherein the moisture blocking film has a first surface and a second surface opposite to the first surface, and the first surface directly contacts the flexible base; and forming a touch structure on the moisture blocking film. The step of forming the touch structure on the moisture blocking film includes forming a first conductive layer on the second surface of the moisture blocking film, wherein the first conductive layer directly contacts the second surface; forming a first insulating layer on the first conductive layer, wherein the first insulating layer covers the first conductive layer; forming a second conductive layer on the first insulating layer; and forming a second insulating layer on the second conductive layer, wherein the second insulating layer covers the second conductive layer.

Since the touch module of the present invention includes the moisture blocking film disposed between the flexible base and the touch structure, it can provide a better moisture blocking effect compared to current touch modules.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
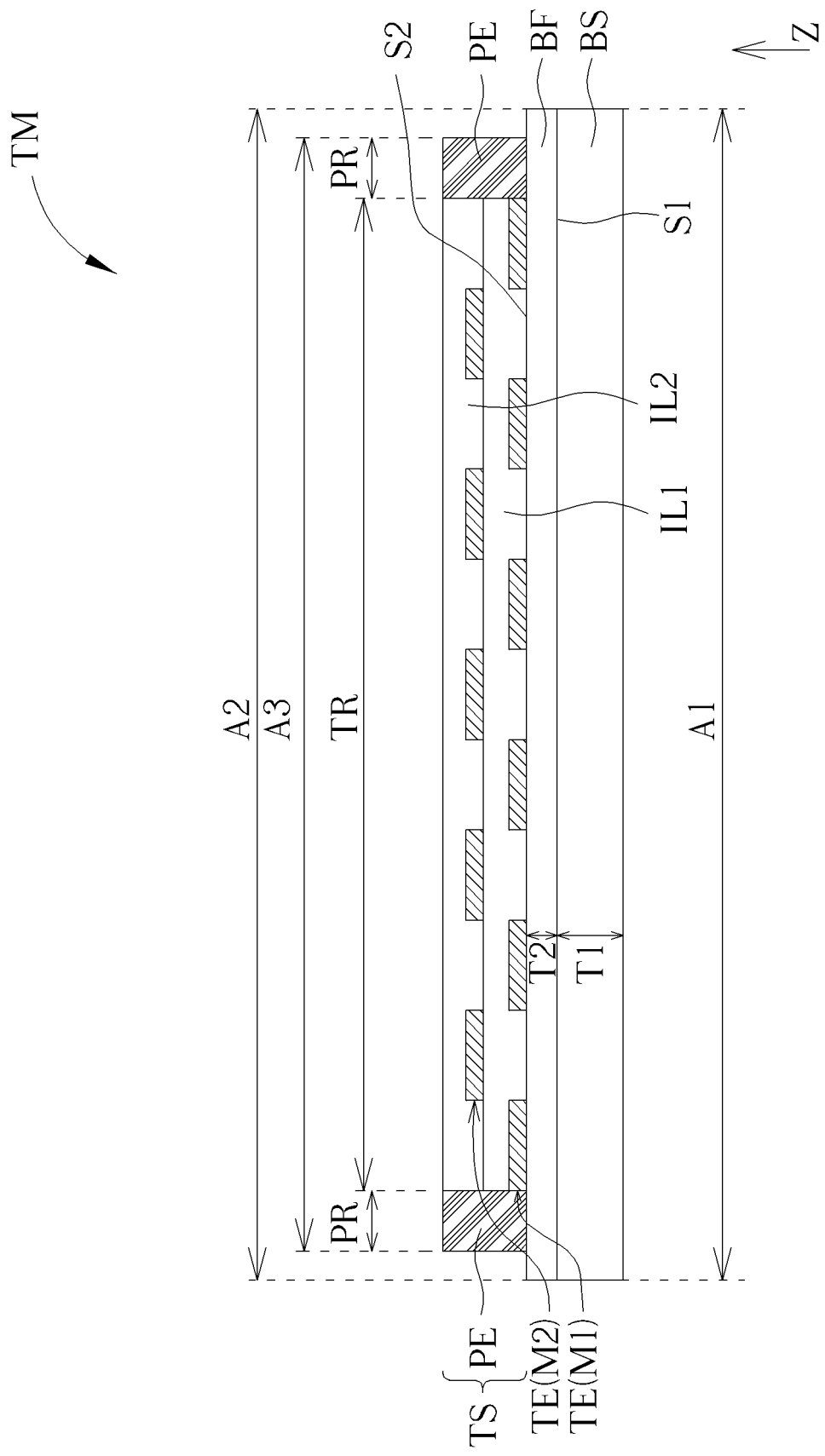
FIG. 1 schematically illustrates a cross-sectional view of a touch module of the present invention.

The present invention may be understood by reference to the following detailed description, taken in conjunction with the drawings as described below. It is noted that, for purposes of illustrative clarity and being easily understood by the readers, only a portion of the device or structure are shown in the drawings, and certain elements in the drawings may not be drawn to scale. In addition, the number and dimension of each element shown in drawings are only illustrative and are not intended to limit the scope of the present invention.

Certain terms are used throughout the description and following claims to refer to particular elements. As one skilled in the art will understand, the manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It should be noted that the technical features in different embodiments described in the following can be replaced, recombined, or mixed with one another to constitute another embodiment without departing from the spirit of the present invention.

Referring to FIG. 1, FIG. 1 schematically illustrates a cross-sectional view of a touch module of the present invention. The touch module TM of the present invention may include a film sensor or other suitable sensing elements. According to the present invention, the touch module TM includes a flexible base BS, a moisture blocking film BF disposed on the flexible base BS, and a touch structure TS disposed on the moisture blocking film BF. In other words, the moisture blocking film BF is disposed between the flexible base BS and the touch structure TS. The structures of the elements of the touch module TM of the present invention will be detailed in the following.

According to the present invention, the flexible base BS may include any suitable flexible material. The flexible material may for example include polyimide (PI), polyethylene terephthalate (PET), other suitable materials or combinations of the above-mentioned materials. The flexible base BS can provide the supporting effect to the elements and/or the layers in the touch module TM. In other words, the flexible base BS can support the moisture blocking film BF and the touch structure TS disposed thereon. The flexible base BS has a thickness T1, wherein the thickness T1 may for example range from 25 micrometers (μm) to 100 μm. The thickness T1 may be defined as the maximum thickness of the flexible base BS in the top view direction (that is, the direction Z, which will not be redundantly described in the following) of the touch module TM, but not limited thereto. As shown in FIG. 1, the flexible base BS may include a single-layer structure, such as the single-layer structure formed of polyimide or polyethylene terephthalate, but not limited thereto. In other embodiments, the flexible base BS may include a multi-layer structure formed of the above-mentioned flexible materials.

According to the present invention, the moisture blocking film BF is disposed between the flexible base BS and the touch structure TS. In detail, the moisture blocking film BF may be disposed on the flexible base BS before disposing the touch structure TS on the flexible base BS. The moisture blocking film BF can be directly disposed on the flexible base BS. The moisture blocking film BF has a first surface S1 and a second surface S2 opposite to the first surface S1, wherein the first surface S1 directly contacts the flexible base BS. The moisture blocking film BF may include silicon oxide, silicon nitride, silicon oxynitride, other suitable insulating materials or combinations of the above-mentioned materials. It should be noted that although FIG. 1 shows that the moisture blocking film BF has a single-layer structure, the present invention is not limited thereto. The moisture blocking film BF may include a single-layer structure, a double-layer structure or a multi-layer structure. In the embodiment where the moisture blocking film BF includes a single-layer structure, the moisture blocking film BF may for example include silicon nitride ($SiN_x$), silicon dioxide ($SiO_2$) or silicon oxynitride ($SiO_xN_y$). In the embodiment where the moisture blocking film BF includes a double-layer structure, the moisture blocking film BF may for example include a double-layer structure formed by stacking the above-mentioned materials or a double-layer structure formed by stacking the above-mentioned materials and an over coating layer (named as OC in the following), such as $OC/SiO_2$, $OC/SiO_xN_y$, $OC/SiN_x$, $SiN_x/SiO_2$ or $SiO_xN_y/SiO_2$, but not limited thereto. The over coating layer may include any suitable insulating material. In the embodiment where the moisture blocking film BF includes a multi-layer structure, the moisture blocking film BF may for example include a multi-layer structure formed by stacking the above-mentioned materials or a multi-layer structure formed by stacking the above-mentioned materials and an over coating layer, such as $SiN_x/OC/SiO_2$, but not limited thereto.

According to the present invention, the moisture blocking film BF may be directly disposed on the surface of the flexible base BS through a coating process. In other words, the moisture blocking film BF is a thin film coated on the surface of the flexible base BS. The moisture blocking film BF can be comprehensively coated on the surface of the flexible base BS, wherein the surface of the flexible base BS can be a flat surface, but not limited thereto. Therefore, in the top view direction of the touch module TM, the flexible base BS may have an area A1, and the moisture blocking film BF may have an area A2, wherein the area A1 may be equal to the area A2. The moisture blocking film BF has a thickness T2, wherein the thickness T2 may for example range from 1 μm to 5 μm, but not limited thereto. The thickness T2 may be defined as the maximum thickness of the moisture blocking film BF in the top view direction of the touch module TM, but not limited thereto.

According to the present invention, the moisture blocking film BF can provide the effect of blocking moisture, thereby preventing moisture from entering from a side of the flexible base BS and corroding the elements in the touch structure TS. Specifically, a water vapor transmission rate (WVTR) of the moisture blocking film BF of the present invention is less than $5.0*10^{-4}$ g/(m$^2$*day) at a temperature of 60° C. and a relative humidity of 90%, which is lower than a water vapor transmission rate of the flexible base BS. For example, in an embodiment, the moisture blocking film BF includes a multi-layer stacked structure of $SiN_x/SiO_2/SiN_x/SiO_2/OC/SiN_x/SiO_2/SiN_x/SiO_2$, wherein the water vapor transmission rate of the moisture blocking film BF may be less than $1.5*10^{-4}$ g/(m$^2$*day), but not limited thereto. In the above-mentioned moisture blocking film BF, the thickness of each of the silicon nitride ($SiN_x$) layers and the silicon dioxide ($SiO_2$) layers may for example range from 5 nanometers (nm) to 30 nm, and the thickness of the over coating layer (OC) may for example range from 1 μm to 3 μm, but not limited thereto. By disposing the moisture blocking film BF between the flexible base BS and the touch structure TS of the touch module TM, the possibility that moisture enters from a side of the flexible base BS and corrodes the touch structure TS may be reduced through the moisture blocking film BF, thereby improving the reliability of the touch module TM.

According to the present invention, the touch structure TS is directly disposed on the surface of the moisture blocking film BF opposite to the flexible base BS, that is, the touch structure TS is disposed on the second surface S2 of the moisture blocking film BF. The touch structure TS includes a first conductive layer M1, a first insulating layer IL1, a second conductive layer M2, and a second insulating layer IL2. The first conductive layer M1 is directly disposed on the second surface S2 of the moisture blocking film BF, that is, the first conductive layer M1 contacts the moisture blocking film BF. The first insulating layer IL1 is disposed on the first conductive layer M1 and covers the first conductive layer M1. The second conductive layer M2 is directly disposed on the first insulating layer IL1 and contacts the first insulating layer IL1. The second insulating layer IL2 is disposed on the second conductive layer M2 and covers the second conductive layer M2. In other words, the touch structure TS directly contacts the moisture blocking film BF. The first conductive layer M1 and the second conductive layer M2 may include any suitable conductive material, such as transparent conductive materials, but not limited thereto. The transparent conductive material may for example include indium tin oxide (ITO), indium zinc oxide (IZO) or other transparent conductive materials. In other embodiments, the first conductive layer M1 and the second conductive layer M2 may include metal materials, such as gold, silver, copper, aluminum or combinations of the above-mentioned materials, and the first conductive layer M1 and the second conductive layer M2 may have metal mesh structures. The first insulating layer IL1 and the second insulating layer IL2 may include any suitable insulating material. As shown in FIG. 1, the touch structure TS has a touch electrode region TR and a peripheral circuit region PR, and the touch structure TS includes touch electrodes TE and peripheral elements PE, wherein the touch electrodes TE are disposed in the touch electrode region TR, and the peripheral elements PE are disposed in the peripheral circuit region PR. The touch electrode region TR may for example be defined through the outer edge of the touch electrodes TE, and the peripheral circuit region PR may be the region of the touch structure TS except the touch electrode region TR for disposing peripheral elements PE. The touch electrodes TE are formed of the first conductive layer M1 and the second conductive layer M2, and the touch electrodes TE may for example (but not limited thereto) be transparent electrodes or metal mesh electrodes. The peripheral elements PE include peripheral 1 wires and/or other suitable electronic elements electrically connected to the touch electrodes TE. It should be noted that the peripheral elements PE are exemplarily shown as square frames in FIG. 1, the detailed structures of the peripheral elements PE are not shown, and the square frames shown in FIG. 1 are not intended to limit the real structure and disposition of the peripheral elements PE. In some embodiments, the peripheral wires and/or other electronic elements in the peripheral elements PE may be formed of the first conductive layer M1 and/or the second conductive layer M2, and the first insulating layer IL1 and the second insulating layer IL2 may extend to the peripheral circuit region PR, which is not limited to what is shown in FIG. 1.

According to the present invention, in the top view direction of the touch module TM, the touch structure TS has an area A3, wherein the area A2 of the moisture blocking film is greater than or equal to the area A3 of the touch structure TS. The area of the touch structure TS may substantially be equal to the sum of the area of the touch electrode region TR and the area of the peripheral circuit region PR. In other words, the area A2 of the moisture blocking film is greater than or equal to the sum of the area of the touch electrode region TR and the area of the peripheral circuit region PR. Therefore, the area A2 of the moisture blocking film BF may be greater than the area of the touch electrode region TR in the touch module TM of the present invention. Through the above-mentioned design, the moisture blocking film BF can completely cover the touch structure TS. Specifically, the touch structure TS can be completely overlapped by the moisture blocking film BF in the top view direction (that is, the direction Z) of the touch module TM. Therefore, the moisture blocking film BF can provide the moisture blocking effect of the touch electrodes TE and the peripheral elements PE.

In current display modules, the touch structure (including touch electrodes, peripheral elements, and the like) is disposed on the flexible base. However, since the moisture blocking effect of the flexible base is poor, the touch electrodes and peripheral elements in the touch module may be easily corroded by moisture and damaged. In contrast, in the touch module TM of the present invention, since the moisture blocking film BF would be coated on the flexible base BS before the touch structure TS is disposed, and then the touch structure TS is disposed on the moisture blocking film BF, when the touch module TM is being used, the moisture blocking film BF would be located at the outer side (in FIG. 1, the lower side of the flexible base BS is the user's operation surface) of the touch structure TS. Therefore, the influence of moisture on the touch structure TS can be reduced to protect the touch structure TS, thereby improving the reliability of the touch module TM. In addition, the moisture blocking film BF coated on the flexible base BS may have a lower thickness compared with other layers (such as the flexible base BS) of the touch module TM, and therefore, the effect of the moisture blocking film BF on the entire thickness of the touch module TM may be reduced. Moreover, by comprehensively disposing the moisture blocking film BF on the flexible base BS, the touch structure TS may be completely overlapped with the moisture blocking film BF, such that the moisture blocking film BF can provide effective moisture blocking effect to the touch electrodes TE and the peripheral elements PE.

Figure 2:
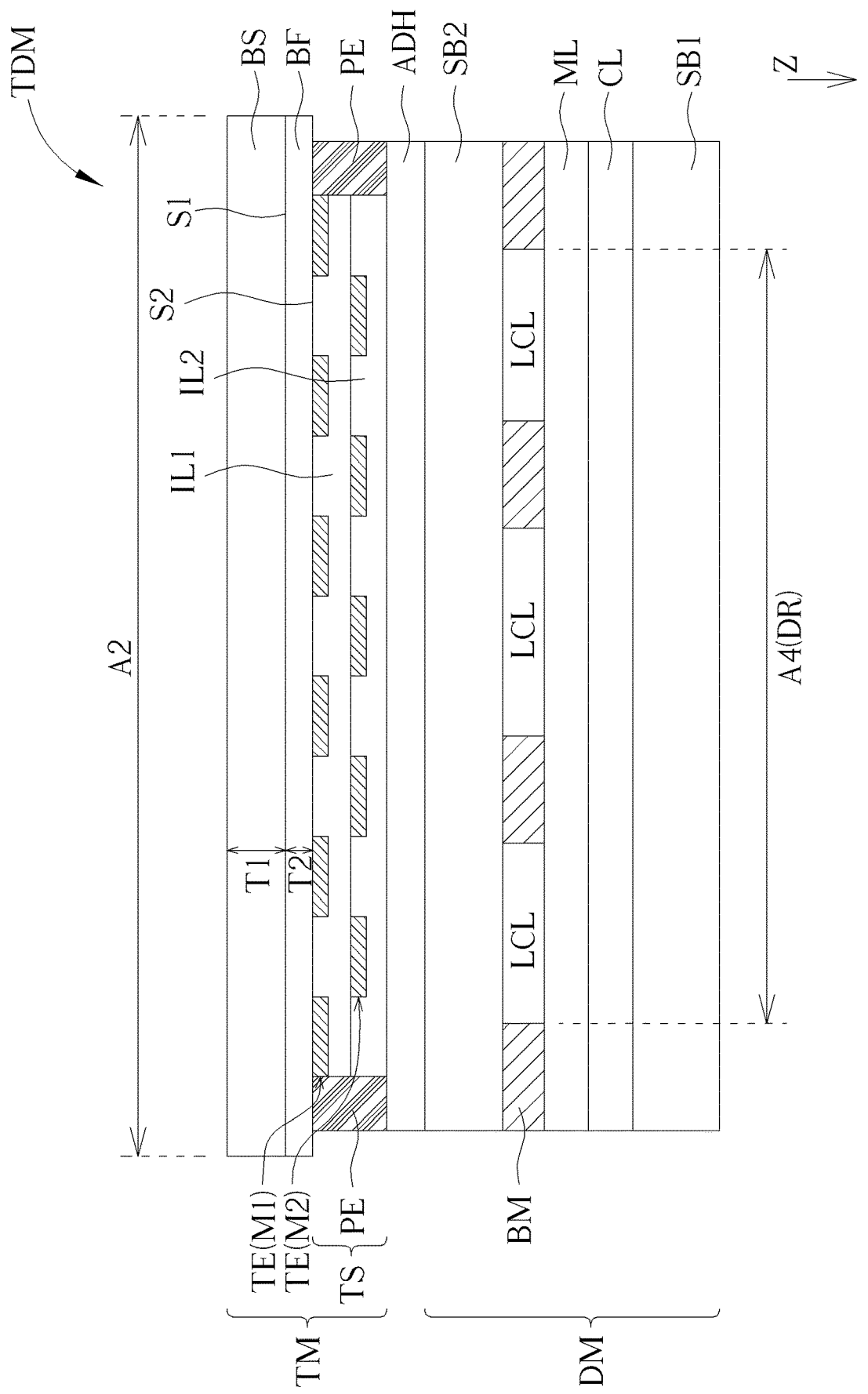
FIG. 2 schematically illustrates a cross-sectional view of a touch display module of the present invention.

Referring to FIG. 2, FIG. 2 schematically illustrates a cross-sectional view of a touch display module of the present invention. Specifically, the touch display module TDM shown in FIG. 2 is a structure formed by inverting the touch module TM shown in FIG. 1 and attaching it to a display module DM. In detail, the display module DM can be attached to the touch module TM through an adhesive layer ADH. The display module DM can be attached to a side of the touch module TM where the touch structure TS is located, that is, the touch structure TS is located between the moisture blocking film BF and the display module DM.

The display module DM may be a display panel, such as a self-emissive display panel or a non-self-emissive display panel. For example, the display module DM may be a liquid crystal display panel, an organic light emitting diode display panel, a micro light emitting diode display panel, a mini light emitting diode display panel, a reflective display panel (such as electronic paper display (EPD)) or other suitable display panels. Specifically, as shown in FIG. 2, the display module DM may include a first substrate SB1, a second substrate SB2 and a display medium layer ML disposed between the first substrate SB1 and the second substrate SB2. When the touch module TM is attached to the display module DM to form the touch display module TDM, the first substrate SB1 can be attached to the touch structure TS of the touch module TM (such as the second insulating layer IL2 of the touch structure TS) through the adhesive layer ADH. The first substrate SB1 and the second substrate SB2 may include rigid substrates or flexible substrates. The rigid substrate may include glass, quartz, sapphire, ceramic, other suitable materials or combinations of the above-mentioned materials. The flexible substrate may include a polyimide (PI) substrate, a polycarbonate (PC) substrate, a polyethylene terephthalate (PET) substrate, other suitable substrates or combinations of the above-mentioned substrates. The first substrate SB1 may serve as an array substrate, and a circuit layer CL may be disposed thereon. The circuit layer CL may include connecting pads, wires, driving elements or other suitable electronic elements, but not limited thereto. The second substrate SB2 may serve as a color filter substrate, and a light converting layer LCL and a black matrix layer BM may be disposed thereon. The light converting layer LCL includes any suitable material capable of converting wavelength or color of light, such as quantum dots, color filters, phosphor, fluorescent materials or other suitable materials. The circuit layer CL, the light converting layer LCL and the black matrix layer BM are disposed between the first substrate SB1 and the second substrate SB2. The display module DM can emit lights or display images through the display medium layer ML. The elements included in the display medium layer ML are determined by the type of display module DM. For example, when the display module DM includes a light emitting diode display panel, the display medium layer ML may include light emitting diodes; and when the display module DM includes a liquid crystal display panel, the display medium layer ML may include a liquid crystal layer, but not limited thereto. It should be noted that the structure of the display module DM shown in FIG. 2 is exemplary, and the display module DM may further include other suitable elements and/or layers. For example, the display module DM may further include a back light module (not shown).

As shown in FIG. 2, since the touch module TM includes the moisture blocking film BF disposed between the flexible base BS and the touch structure TS, when the touch module TM is attached to the display module DM, the moisture blocking film BF is located on the display module DM and the touch structure TS, and the flexible base BS is located on the moisture blocking film BF. Therefore, compared with the display module DM and the touch structure TS, the moisture blocking film BF is located at the outer side of the device or the product, such that the moisture blocking film BF can provide the moisture blocking effect to both the display module DM and the touch structure TS. In addition, since the moisture blocking film BF can provide the moisture blocking effect to the entire touch display module TDM, the touch display module TDM may not include other moisture blocking layers or protecting layers disposed on the flexible base BS, or it is not necessary to dispose additional moisture blocking layer on the display module DM. Therefore, the thickness of the entire touch display module TDM can be reduced. In some embodiments, the touch display module TDM may include other layers disposed on the flexible base BS.

In the top view direction of the touch module TM, an area of the display module DM is less than or equal to the area A2 of the moisture blocking film BF, that is, the display module DM is completely overlapped with the moisture blocking film BF. In addition, the display module DM may have a display region DR, wherein the display region DR is the region of the display module DM where the light is emitted. The display region DR may for example be defined as the region enclosed by the outer edge of the light converting layer LCL, but not limited thereto. According to the present invention, in the top view direction of the touch module TM, the display region DR has an area A4, and the area A2 of the moisture blocking film BF is greater than the area A4 of the display region DR. Through the above-mentioned design, the moisture blocking effect of the moisture blocking film BF on elements (such as driving elements, light emitting elements, and the like) in the display module DM can be improved.

In addition, the moisture blocking film BF of the present invention can have good optical properties. Specifically, the average light transmittance of the moisture blocking film BF at wavelengths from 400 to 700 nm is greater than 85%. In addition, the chromaticity a* value of the moisture blocking film BF may be located between −2 and 2 (that is, −2<a*<2), and the chromaticity b* value of the moisture blocking film BF may be located between −3 and 3 (that is, −3<b*<3). For example, in an embodiment, the moisture blocking film BF includes the double-layer structure of $SiN_x/SiO_2$, wherein the average light transmittance of the moisture blocking film BF at wavelengths from 400 to 700 nm is greater than 868. In another embodiment, the moisture blocking film BF includes the multi-layer structure of $SiN_x/SiO_2/SiN_x/SiO_2/OC/SiN_x/SiO_2/SiN_x/SiO_2$, wherein the average light transmittance of the moisture blocking film BF at wavelengths from 400 to 700 nm is greater than 878, the chromaticity a* value of the moisture blocking film BF may be located between −2 and 2 (that is, −2<a*<2), and the chromaticity b* value of the moisture blocking film BF may be located between −3 and 3 (that is, −3<b*<3). Therefore, even if the moisture blocking film BF is disposed in the touch module TM, the influence of the touch module TM on the display effect of the display module DM would not be significant. In another aspect, the moisture blocking film BF may serve as an optical adjusting layer. In the present invention, the moisture blocking film BF can include any suitable stacked structure according to the demands of the design of the touch display module TDM, so as to have both moisture blocking effect and good optical properties.

Figure 3:
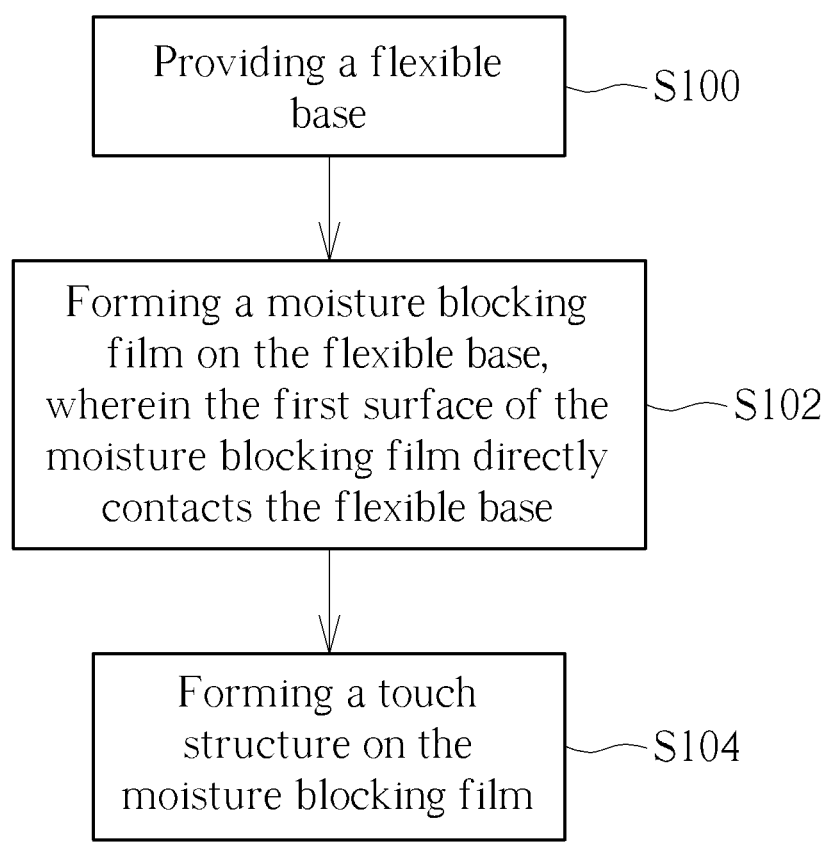
FIG. 3 and FIG. 4 show the flow charts of the manufacturing method of the touch module of the present invention.
Figure 4:
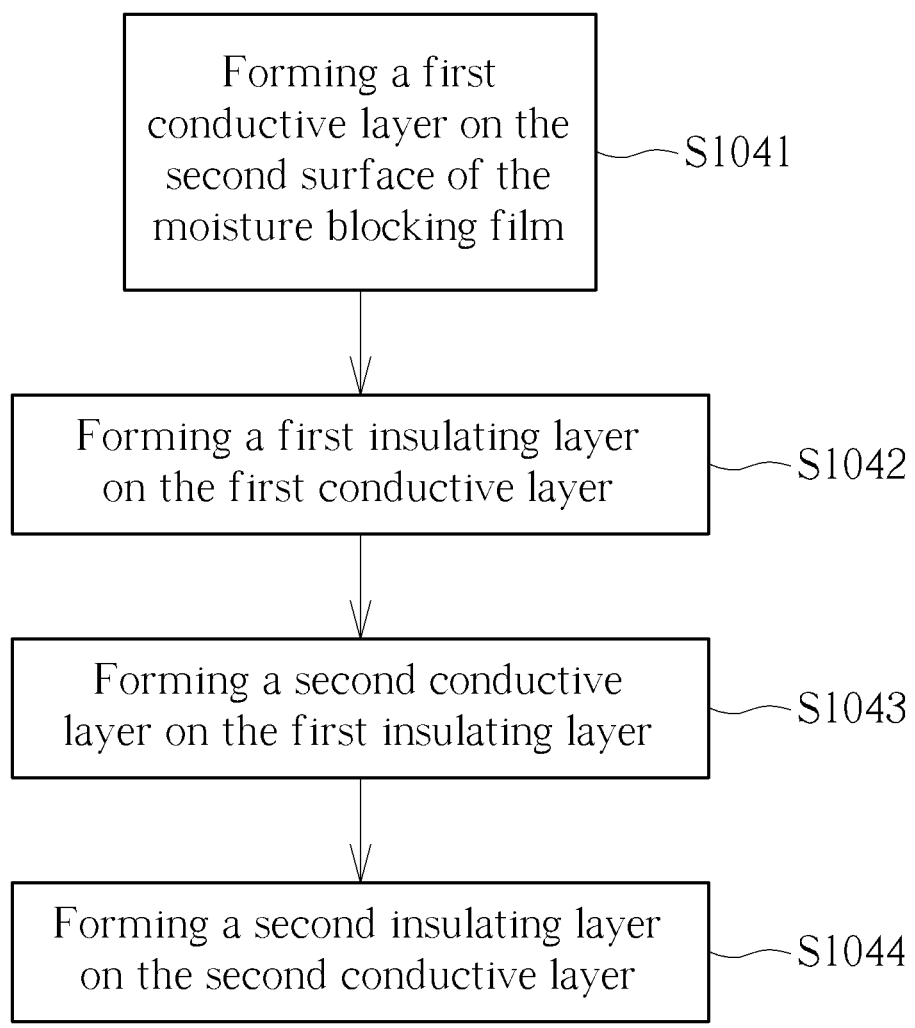

Referring to FIG. 3 and FIG. 4, FIG. 3 and FIG. 4 show the flow charts of the manufacturing method of the touch module of the present invention. The manufacturing method M100 of the touch module TM of the present invention can include the following steps:

S100: providing a flexible base;
S102: forming a moisture blocking film on the flexible base, wherein the first surface of the moisture blocking film directly contacts the flexible base; and
S104: forming a touch structure on the moisture blocking film.

Wherein the step S104 of forming the touch structure on the moisture blocking film includes:

S1041: forming a first conductive layer on the second surface of the moisture blocking film;
S1042: forming a first insulating layer on the first conductive layer;
S1043: forming a second conductive layer on the first insulating layer; and
S1044: forming a second insulating layer on the second conductive layer.

In detail, in the manufacturing method M100 of the touch module TM, the step S100 may be performed at first to provide the flexible base BS. The material and other features of the flexible base BS may refer to the contents mentioned above, and will not be redundantly described.

Then, the step S102 may be performed to form the moisture blocking film BF on the flexible base BS. The moisture blocking film BF may be comprehensively or blanketly formed on the flexible base BS (or formed on the whole surface of the flexible base BS) through coating, such that the first surface S1 of the moisture blocking film BF directly contacts the flexible base BS. The material and other features of the moisture blocking film BF may refer to the contents mentioned above, and will not be redundantly described.

Then, the step S104 may be performed to form the touch structure TS on the moisture blocking film BF, such that the moisture blocking film BF is located between the flexible base BS and the touch structure TS. The touch structure TS can be directly disposed on the second surface S2 of the moisture blocking film BF.

In the step of forming the touch structure TS on the moisture blocking film BF (the step S104), the step S1041 may be performed at first to form the first conductive layer M1 on the second surface S2 of the moisture blocking film BF. The first conductive layer M1 directly contacts the second surface S2 of the moisture blocking film BF. Then, the step S1042 can be performed to form the first insulating layer IL1 directly on the first conductive layer M1. The first insulating layer IL1 covers the first conductive layer M1. Then, the step S1043 can be performed to form the second conductive layer M2 on the first insulating layer IL1. The second conductive layer M2 directly contacts the first insulating layer IL1. After that, the step S1044 can be performed to form the second insulating layer IL2 on the second conductive layer M2. The second insulating layer IL2 covers the second conductive layer M2. Therefore, the touch structure TS on the moisture blocking film BF can be formed. The first conductive layer M1 and the second conductive layer M2 may be formed by coating. The first insulating layer IL1 and the second insulating layer IL2 may be formed by coating. After the touch structure TS is formed on the moisture blocking film BF, the touch module TM can be formed.

In addition, after the step S104 is performed, a cutting process may optionally be performed to cut the flexible base BS and the layers disposed thereon into a plurality of touch module units to form the touch module TM. Specifically, the touch module TM of the present invention can be formed in a large-plate process, that is, the moisture blocking film BF and the touch structure TS can be comprehensively formed on a large-plate flexible base BS at first, and then the flexible base BS and the moisture blocking film BF and the touch structure TS disposed thereon are cut into a plurality of touch module units (that is, the touch modules TM) according to the size of the product. Since the plurality of touch modules TM can be formed simultaneously in the large-plate process, the coating process and/or the photolithography process (including exposure, development, etching) in the manufacturing process of the touch module TM can be completed at once. Therefore, the yield of the touch module TM per unit time can be improved, or the effect of mass production of the touch module TM can be achieved, thereby reducing production cost.

According to the present invention, the touch module TM can be attached to any suitable display panel (such as the display module DM shown in FIG. 2) to form the touch display module TDM. Specifically, after the touch module TM is formed, the display module DM can be attached to the touch structure TS through the adhesive layer ADH. Therefore, the moisture blocking film BF of the touch module TM can provide the moisture blocking effect to the elements in the touch structure TS and the display module DM, and it is not necessary to dispose additional moisture blocking layers or protecting layers in the touch display module TDM.

In summary, a touch module including a flexible base, a touch structure and a moisture blocking film located between the flexible base and the touch structure is provided by the present invention. The moisture blocking film can effectively reduce the possibility that the moisture enters the flexible base and damage (or corrode) the touch structure. In addition, the touch module can be combined with the display module to form the touch display module, wherein the moisture blocking film can provide the moisture blocking effect to both the touch structure and the display module. Therefore, it is not necessary to dispose additional moisture blocking layers or protecting layers in the touch display module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch display module, comprising:
a touch module, comprising:
a flexible base, wherein a thickness of the flexible base ranges from 25 micrometers to 100 micrometers;
a moisture blocking film disposed on the flexible base, wherein the moisture blocking film has a first surface and a second surface opposite to the first surface, the first surface directly contacts the flexible base, and a thickness of the moisture blocking film ranges from 1 micrometer to 5 micrometers; and
a touch structure disposed on the second surface of the moisture blocking film, comprising:
a first conductive layer directly disposed on the second surface of the moisture blocking film;
a first insulating layer disposed on the first conductive layer and covering the first conductive layer;
a second conductive layer directly disposed on the first insulating layer; and
a second insulating layer disposed on the second conductive layer and covering the second conductive layer; and
a display module attached to the touch module, wherein the display module comprises a first substrate, a second substrate and a display medium layer disposed between the first substrate and the second substrate, and the touch structure is located between the display module and the moisture blocking film,
wherein the touch structure has a touch electrode region and a peripheral circuit region, and an area of the moisture blocking film is greater than or equal to a sum of an area of the touch electrode region and an area of the peripheral circuit region in a top view direction of the touch module;
wherein a water vapor transmission rate of the moisture blocking film is less than $5.0*10^{-4}$ g/(m²*day) at a temperature of 60° C. and a relative humidity of 90%;
wherein the area of the moisture blocking film is greater than an area of the display module.

2. The touch display module of claim 1, wherein the flexible base includes polyimide, polyethylene terephthalate or a combination thereof.

3. The touch display module of claim 1, wherein the moisture blocking film includes silicon oxide, silicon nitride, silicon oxynitride or a combination thereof.

4. The touch display module of claim 1, wherein the area of the moisture blocking film is greater than the area of the touch electrode region in the top view direction of the touch module.

5. The touch display module of claim 1, wherein the display module has a display region, and the area of the moisture blocking film is greater than an area of the display region in the top view direction of the touch module.

6. The touch display module of claim 1, wherein the display module includes a liquid crystal display panel, an organic light emitting diode display panel, a micro light emitting diode display panel or a mini light emitting diode display panel.

7. A manufacturing method of a touch display module, comprising:
forming a touch module, comprising:
providing a flexible base;
forming a moisture blocking film on the flexible base, wherein the moisture blocking film has a first surface and a second surface opposite to the first surface, and the first surface directly contacts the flexible base; and forming a touch structure on the moisture blocking film, comprising following steps:
    forming a first conductive layer on the second surface of the moisture blocking film, wherein the first conductive layer directly contacts the second surface;
    forming a first insulating layer on the first conductive layer, wherein the first insulating layer covers the first conductive layer;
    forming a second conductive layer on the first insulating layer; and
    forming a second insulating layer on the second conductive layer, wherein the second insulating layer covers the second conductive layer; and
attaching the touch module to a display module, wherein the display module comprises a first substrate, a second substrate and a display medium layer disposed between the first substrate and the second substrate, and the touch structure is located between the display module and the moisture blocking film,
wherein a water vapor transmission rate of the moisture blocking film is less than $5.0*10^{-4}$ g/(m$^2$*day) at a temperature of 60° C. and a relative humidity of 90%;
wherein an area of the moisture blocking film is greater than an area of the display module.

8. The manufacturing method of claim 7, wherein a thickness of the flexible base ranges from 25 micrometers to 100 micrometers, and a thickness of the moisture blocking film ranges from 1 micrometer to 5 micrometers.

9. The manufacturing method of claim 7, wherein the flexible base includes polyimide, polyethylene terephthalate or a combination thereof, and the moisture blocking film includes silicon oxide, silicon nitride, silicon oxynitride or a combination thereof.

\* \* \* \* \*